(12) United States Patent
Nagey (10) Patent No.: US 9,269,427 B2
(45) Date of Patent: *Feb. 23, 2016

(54) MEMORY DEVICES AND RELATED METHODS

(71) Applicant: Peter K. Nagey, Tempe, AZ (US)

(72) Inventor: Peter K. Nagey, Tempe, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/325,675

(22) Filed: Jul. 8, 2014

(65) Prior Publication Data

US 2014/0321198 A1    Oct. 30, 2014

Related U.S. Application Data

(63) Continuation of application No. 13/481,102, filed on May 25, 2012, now Pat. No. 8,773,887.

(60) Provisional application No. 61/519,557, filed on May 25, 2011.

(51) Int. Cl.
| | |
|---|---|
| *G11C 11/16* | (2006.01) |
| *G11C 13/00* | (2006.01) |
| *G11C 11/56* | (2006.01) |
| *G11C 27/00* | (2006.01) |

(52) U.S. Cl.
CPC .......... *G11C 13/0021* (2013.01); *G11C 11/165* (2013.01); *G11C 11/1673* (2013.01); *G11C 11/5642* (2013.01); *G11C 13/0002* (2013.01); *G11C 13/004* (2013.01); *G11C 27/005* (2013.01)

(58) Field of Classification Search
CPC .............................. G11C 13/0069; G11C 11/16
USPC .................................................. 365/158, 148
See application file for complete search history.

(56) References Cited

U.S. PATENT DOCUMENTS

| | | | |
|---|---|---|---|
| 6,032,220 A | 2/2000 | Martin et al. | |
| 6,222,474 B1 | 4/2001 | Fattaruso et al. | |
| 6,396,733 B1 | 5/2002 | Lu et al. | |
| 6,445,612 B1 | 9/2002 | Naji | |
| 6,647,064 B1 * | 11/2003 | Eguchi | 375/245 |
| 6,718,499 B1 | 4/2004 | Zuras | |
| 6,765,820 B2 | 7/2004 | Lu et al. | |
| 6,807,124 B2 | 10/2004 | Tsuda et al. | |
| 7,266,732 B2 | 9/2007 | Smith et al. | |
| 7,286,423 B2 | 10/2007 | Ramaraju | |
| 7,286,429 B1 | 10/2007 | Liaw et al. | |
| 7,321,507 B2 | 1/2008 | Yang et al. | |
| 7,343,083 B2 * | 3/2008 | Mishima et al. | 386/351 |
| 7,443,737 B2 | 10/2008 | Chu et al. | |
| 7,679,973 B2 | 3/2010 | Chu et al. | |

(Continued)

*Primary Examiner* — Michael Tran (74) *Attorney, Agent, or Firm* — Adam R. Stephenson, Ltd.; Paul B. Johnson (57) ABSTRACT

A resistive memory device. Implementations may include an array of memory cells including resistive memory elements which are coupled to isolation transistors and which may include a magnetic tunnel junction. A decoder decodes input address information to select a row of the array. A binarizer coupled to the memory array assigns binary weights to outputs of the memory array output through bit lines coupled to the memory cells. A summer sums the binary weighted outputs, and a quantizer generates an output digital code corresponding to data stored in a plurality of memory cells during a prior program cycle. The outputs of the memory array may be currents or voltages. In implementations multiple arrays of memory cells may be utilized and their respective outputs combined to form higher bit outputs, such as eight bit, twelve bit, sixteen bit, and so forth.

20 Claims, 8 Drawing Sheets

(56) References Cited

U.S. PATENT DOCUMENTS

| | | |
|---|---|---|
| 7,852,662 B2 | 12/2010 | Yang et al. |
| 7,957,207 B2 | 6/2011 | Parkinson |
| 8,040,719 B2 | 10/2011 | Cho et al. |
| 8,289,764 B2 | 10/2012 | Hanzawa |
| 8,594,205 B2 * | 11/2013 | Jafarkhani et al. ............ 375/245 |
| 8,660,183 B2 * | 2/2014 | Miyaji et al. ............. 375/240.16 |
| 8,958,479 B2 * | 2/2015 | Mochizuki et al. ...... 375/240.16 |
| 2011/0080769 A1 | 4/2011 | Chen et al. |

* cited by examiner

MEMORY DEVICES AND RELATED METHODS

CROSS REFERENCE TO RELATED APPLICATIONS

This document is a continuation application of U.S. Non-provisional Utility application Ser. No. 13/481,102, entitled "Resistive Memory Devices and Related Methods," naming as first inventor Peter K. Naji, which was filed on May 25, 2012 and issued on Jul. 8, 2014 as U.S. Pat. No. 8,773,887, which in turn claims the benefit of the filing date of U.S. Provisional Patent Application No. 61/519,557, entitled "Memory architecture for resistance-based memories" to Peter K. Naji which was filed on May 25, 2011, the disclosures of each of which are hereby incorporated entirely herein by reference.

BACKGROUND

1. Technical Field

Aspects of this document relate generally to random-access memories.

2. Background Art

Memories are used in computers and related devices to store data. Random-access memories (RAM) are used in a variety of computers and related devices.

SUMMARY

Implementations of memory devices may include: an array of memory cells, each memory cell having a resistive memory element programmable between a high resistance state and a low resistance state; a decoder electrically coupled to one or more word lines included in the array of memory cells, the decoder configured to decode an address input to select a word line of the one or more word lines included in the array of memory cells; a binarizer electrically coupled to the array of memory cells and configured to receive a plurality of memory cell outputs from the array of memory cells and generate a plurality of binary weighted memory cell outputs in response to the decoder selecting a word line of the one or more word lines of the array of memory cells, wherein each binary weighted memory cell output corresponds with one memory cell; a summer electrically coupled to the binarizer and configured to sum the binary weighted memory cell outputs into an analog signal; and a quantizer electrically coupled to the summer and configured to convert the analog signal into a digital output.

Implementations of memory devices may include one, all, or any of the following:

The binarizer may include a voltage clamping transistor and at least one pair of load transistors and the pair of load transistors may be configured to binarily weight and amplify, through a current mirror, a current corresponding with a memory cell.

The digital output may be a plurality of data bits corresponding with data stored on memory cells of a word line of the one or more word lines of the array of memory cells.

A read data path of the memory device may include a (4+m)n bit data path having (4+m)n memory cells, (4+m)n clamp transistors, (4+m)n weighted current mirrors, a (4+m)n input summer and a (4+m)n bit quantizer, and the memory device may be configured to resolve (4+m)n bits of stored data simultaneously, wherein in is an integer and n is a positive integer.

The device may further include a plurality of arrays of memory cells and a plurality of bit line select blocks, each array of memory cells forming a macro portion, each macro portion electrically coupled to one of the bit line select blocks and further coupled to a first decoder through word lines, where the first decoder is configured to decode one of a first and second address input to select a word line, and wherein each bit line select block is coupled to a second decoder configured to decode a third address input to select one of the bit line select blocks.

A plurality of arrays of memory cells of the device may form a plurality of identical parallel (4+m) bit read data paths to generate (4+m)n output data bits, where m is an integer and n is a number corresponding with the number of identical parallel (4+m) bit read data paths.

The memory device may include: four 4×4 arrays of memory cells; four bit line select blocks, each bit line select block electrically coupled to one 4×4 array of memory cells; two binarizers, each binarizer electrically coupled to two bit line select blocks; two summers, each summer electrically coupled to one binarizer; and two 4-bit current quantizers, each 4-bit current quantizer coupled to one summer.

The resistive memory element may include a resistor electrically coupled to an isolation transistor.

The resistive memory elements may each include a magnetic tunnel junction.

Methods of using a memory device may include: decoding a word line address of an array of memory cells through a decoder and selecting the decoded word line, each memory cell having a resistive memory element programmable between a high resistance state and a low resistance state; applying a control voltage to clamp transistors coupled to memory cells of the selected word line; assigning binary weights to hit currents to form binary weighted bit line currents; summing the binary weighted bit line currents to generate an analog output current; and quantizing the analog output current into a 4n bit digital code through a current quantizer, where n is a positive integer.

Methods of using a memory device may include one, all, or any of the following:

Decoding at least one group of (4+m)n bit line addresses of the array of memory cells and selecting the decoded bit lines, and applying the control voltage to clamp transistors coupled to memory cells of the selected bit lines, wherein in is an integer and n is a positive integer.

Assigning weights to bit line currents may include passing each bit line current through a pair of load transistors configured to binarily weight the bit line current through a current mirror.

Amplifying the bit line currents.

Providing a plurality of arrays of memory cells, each array of memory cells forming a macro portion, and providing a plurality of bit line select blocks and electrically coupling each macro portion to one of the bit line select blocks and further coupling each macro portion to a first decoder through word lines where the first decoder is configured to decode one of a first and second address input to select a word line, and further coupling each bit line select block to a second decoder configured to decode a third address input to enable selection of one of the bit line select blocks.

Decoding an address associated with a bit line select block through a second decoder and selecting a bit line select block associated with that address.

Methods of using a memory device may include: decoding a word line address of an array of memory cells through a decoder and selecting the decoded word line, each memory cell having a resistive memory element programmable between a high resistance state and a low resistance state; applying a current to memory cells of the selected word line; assigning binary weights to bit line voltages to form binary weighted bit line voltages; summing the binary weighted bit line voltages to generate an analog output voltage; and quantizing the analog output voltage into a (4+m)n bit digital code through a quantizer, wherein in is an integer and n is a positive integer.

Methods of using a memory device may include one, all, or any of the following:

Decoding at least one group of (4+m)n bit line addresses of the array of memory cells, selecting the decoded bit lines, and applying the current to clamp transistors coupled to memory cells of the selected bit lines, wherein in is an integer and n is a positive integer.

Assigning binary weights to bit line voltages may include assigning binary weights to bit line voltages with voltage multipliers.

Providing a plurality of arrays of memory cells, each array of memory cells forming a macro portion; providing a plurality of bit line select blocks; electrically coupling each macro portion to one of the bit line select blocks and further coupling each macro portion to a first decoder through word lines, where the first decoder is configured to decode one of a first and a second address input to select a word line; and coupling each bit line select block to a second decoder configured to decode a third address input to enable selection one of the bit line select blocks.

Decoding an address associated with a bit line select block through a second decoder and selecting a bit line select block associated with that address.

The foregoing and other aspects, features, and advantages will he apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components or assembly procedures disclosed herein. Many additional components and assembly procedures known in the art consistent with the intended resistance based memory devices and related methods and/or assembly procedures for resistance based memory devices will become apparent for use with particular implementations from this disclosure. Accordingly, for example, although particular implementations of resistance based memory devices and related methods are disclosed, such implementations and implementing components and steps, methods and modalities may include any shape, size, style, type, model, version, measurement, concentration, material, quantity, method, step, modality and/or the like as is known in the art for such resistance based memory devices, related methods and implementing components and methods consistent with the intended operation.

Figure 1:
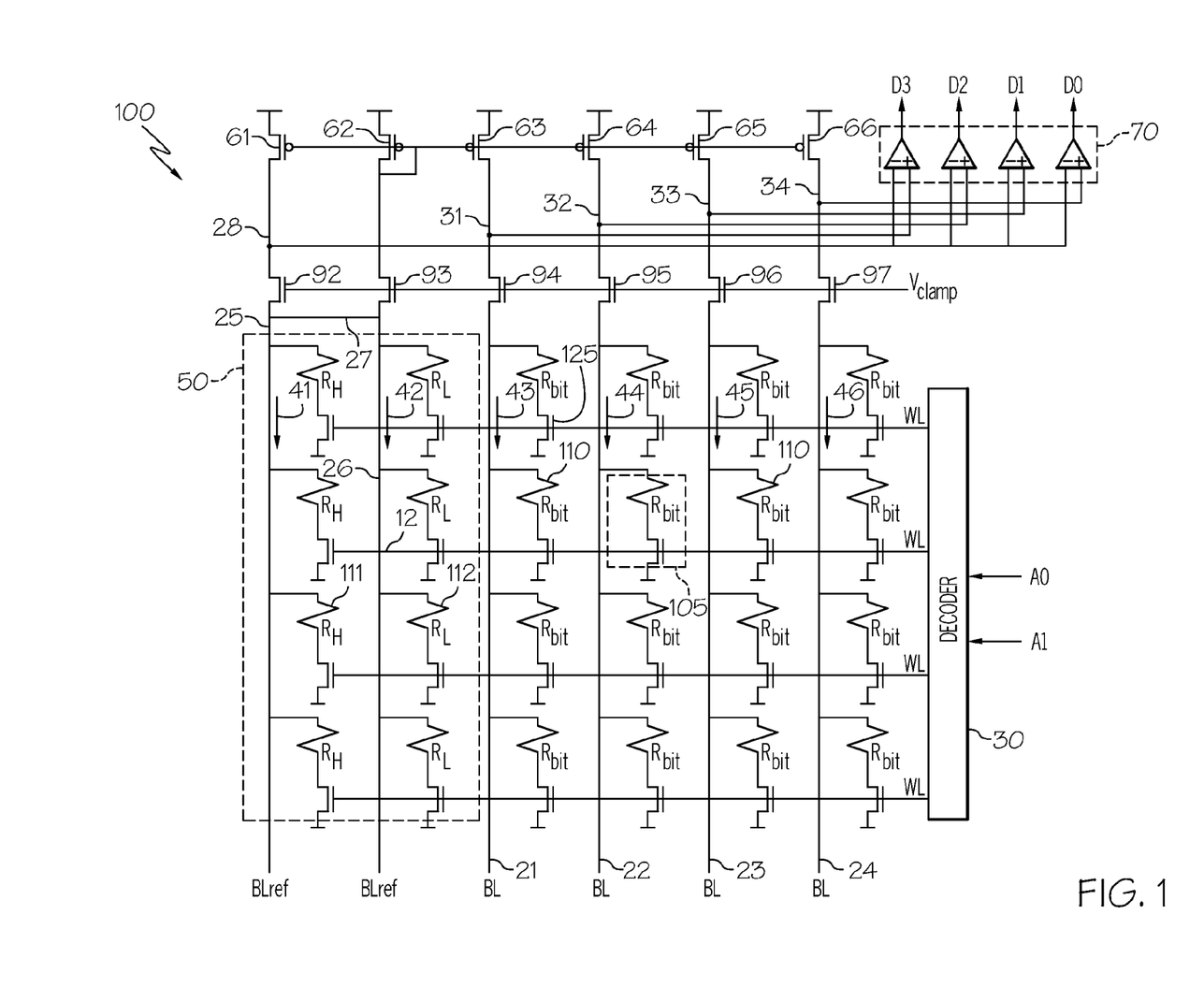
FIG. 1 is an illustration of a conventional memory device.

Referring to FIG. 1, the architecture of a conventional resistive random-access memory (memory, memory device) (ReRAM) 100 such as a magnetoresistive random-access memory 100 (MRAM) is generally composed of a plurality or array of memory cells (cells) 105 and a plurality of word line (digit line, word/digit line, digit/word line) (WL) 12 and bit line (BL) 21, 22, 23, 24 intersections. The resistive memory cell 105 includes a resistive element (memory element, resistive memory element, data memory element) (RME) 110. In implementations the RME 110 could include, by non-limiting example, a magnetic tunnel junction (MTJ), an isolation transistor (isolation device, selection/isolation transistor, selection transistor) 125, and intersection of digit/word line 12 and bit lines 21, 22, 23 or 24. The isolation transistor 125 may be, by non-limiting example: an N-channel field effect transistor (FET); a junction diode; and so forth. An interconnect stack connects the isolation transistor 125 to the MTJ device to the bit line 21, 22, 23 or 24. The digit/word line 12 is used to control isolation transistor 125 and/or to create a portion of the energy necessary for programming the resistive memory element 110. Resistive memory elements 110 in implementations my include, by non-limiting example: Field induced Switching Magnetoresistive Random Access Memories (FIS-MRAM), Spin Transfer Torque MRAMs (STT-MRAM), Giant Magneto Resistivity MRAMs (GMR-MRAM), Phase-Change RAMs (PCRAM), Metallization or Conductive Bridging RAMs (CBRAM), and so forth. A resistive memory element 110 has relatively high resistance in one state of programming and a relatively low resistance in the other. For example an MTJ element has a relatively high resistance when the free and pinned magnetic vectors are misaligned and a relatively low resistance when they are aligned. Resistive memory cells 105 may be read by forcing a voltage and measuring a current or forcing a current and measuring a voltage. In both cases a current flows through both the resistive memory element 110 and its isolation device 125. Similarly, in all cases the measured voltage or current is compared to a reference voltage or current, respectively. This reference is selected to be at a midpoint between the two states of the memory cell 105. Commonly, the reference is either an externally generated constant or internally generated using resistive memory elements (reference memory elements) (memory elements) 111, 112 for better correspondence to the non-uniformity of resistive memory elements 110 due to processing variations during manufacture.

The conventional memory device 100 of FIG. 1 represents a sixteen bit, four bit wide memory. It has six columns and four rows, where the sixth and fifth columns form reference block 50. The reference columns (reference bit lines, bit lines) (BLref) 25 and 26 consist of the same type resistive memory elements 111, 112 programmed in high and low resistance state respectively. The memory cell (cell) 105 in this embodiment is structured as a resistive memory element 110 having a selection/isolation transistor 125 for connecting the cell 105 to ground during a read operation. A decoder 30 decodes two addresses (address inputs) A0 (first address input) and A1

(second address input) and selects one of four word lines (WL) 12. Upon selection of a word line (WL) 12, four memory elements 110 and two reference memory elements (memory elements) 111 and 112 are activated and current flows through bit lines (BL) 24 and reference bit lines 25 and 26. In a conventional resistive RAM such as MRAM, the following devices are stacked between the supply rails in a typical sense amplifier: the memory cell 105 including isolation transistor 125 and memory element 110, a bit line selection transistor, a voltage clamp transistor, and a PMOS load transistor. Two reference bit lines 25 and 26 are shared within a four bit line wide sixteen bit memory 100. In practice, the two reference bit lines 25, 26 may be shared by a far larger number of bit lines numbering from thirty-two to two hundred fifty-six bit lines. Bit line 25 includes memory elements 111 programmed in high state (high resistance state) $R_H$ and bit line 26 includes memory elements 112 programmed in low state (low resistance state) $R_L$. The midpoint reference current is created by averaging the currents of memory elements 111 and 112 flowing in bit lines 25 and 26. During a read operation, the $V_{clamp}$ voltage (clamp voltage) at the gate of NMOS devices 92, 93, 94, 95, 96, and 97 clamps all bit lines 21 through 26 to the same bias voltage. This results in currents 43 through 46 designated as $I_B$ to flow through bit lines (BL) 21 through 24, and currents 41 ($I_H$) and 42 ($I_L$) to flow through bit lines 25, and 26, a magnitude inversely proportional to the resistance seen on each bit line 21-26. The short 27 between the sources of NMOS devices 92 and 93 acts to average the current flowing through bit lines 25 and 26. The current mirror (weighted current mirror) configuration of PMOS devices 61, 62, 63, 64, 65, and 66 biases each of the six PMOS devices to provide one half the sum of the current flowing through reference bit lines 25 and 26, or $(I_H+I_L)/2$. Differential output voltage between nodes 28 and 31, 32, 33, or 34 responds to the difference between the reference current $(I_H+I_L)/2$ pulling up nodes 31, 32, 33, 34 and current $I_B$ flowing through bit lines 21 through 24 biasing the data memory elements 110. If a memory element 110 being read is in a low resistance state, the corresponding voltage at node 31, 32, 33, or 34 will drop relative to the voltage at node 28. Conversely, a memory element 110 in a high resistance state will cause the voltage at corresponding node 31, 32, 33, or 34 to increase relative to the voltage at node 28. Differential amplifiers 70 amplify the difference between nodes 28 and 31, 32, 33, 34 and generate output data bits (data bits, outputs, digital outputs) D0, D1, D2, and D3.

The smallest differential voltages between nodes 28 and 31, 32, 33, 34 determine the overall memory device speed, yield, and reliability, so the signal generated from memory elements 110, 111, and 112 at the worst case end of the distribution of each state is important. In order to obtain an optimal reference at the midpoint between the average conductance of each memory element state, the relative standard deviation of all memory elements 110-112 in their low resistance state $R_L$ may need to be the same percentage as the relative standard deviation of all memory elements 110-112 in their high resistance state $R_H$. As a result, the two reference columns 25, 26 of memory elements 111, 112 may have to be closely matched to actual columns of memory elements 110. As stated earlier, memory cells 105 in reference block 50 in memory (memory device) 100 are used to generate a reference voltage or current at the midpoint between the two high and low resistance states of a memory element 110-112. As a result, the effective signal of a ReRAM memory element 110 is divided in half.

Figure 2:
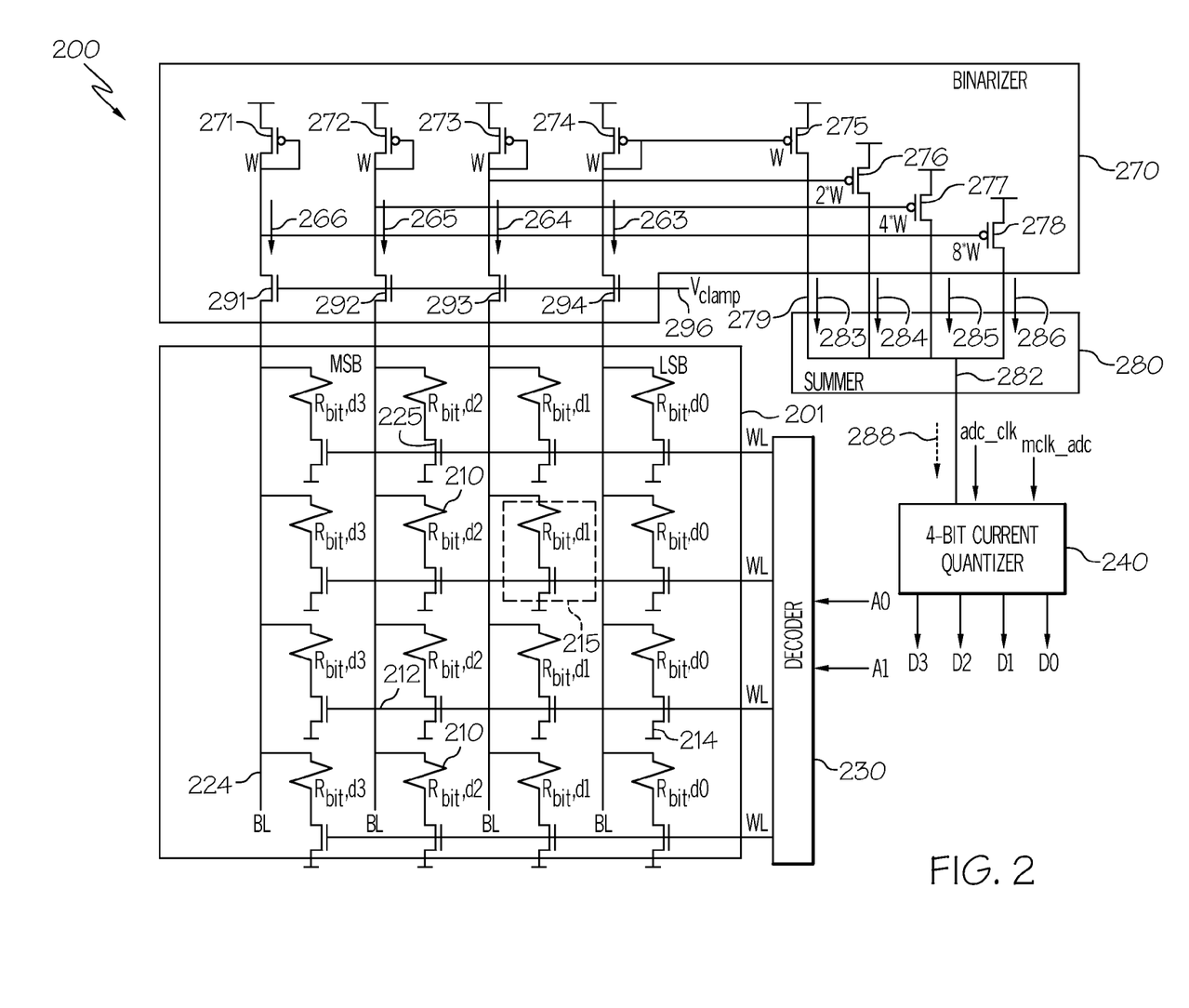
FIG. 2 is an illustration of an implementation of a resistance based memory device.

FIG. 2 is an illustration of an implementation of a memory device (resistive RAM, memory, ReRAM) 200. The ReRAM 200 may include, by non-limiting example: field induced switching magnetoresistivity, spin transfer torque magnetoresistivity, Giant magnetoresistivity, phase-change material, metallization or conductive bridging material, correlated electron materials, and other materials and technologies. The ReRAM 200 may include three dimensional stacked memory cells (resistive memory cells) 215. Memory 200 includes a plurality of memory cells (resistive memory cells) 215 arranged in rows and columns. Individual memory elements (resistors) (resistive memory element) (RME) 210 can be any type of resistive memory element (RME). For convenience of illustration, while it will be understood that a smaller or larger array 201 could be used if desired, in this example memory array (array, array of memory cells, macro portion) 201 includes a four-by-four array 201 of resistive memory cells 215 arranged in four rows and four columns.

Memory cell 215 includes a resistive memory element (RME) 210, electrically represented as a resistor 210 coupled to an isolation transistor 225. In implementations the RME 210 may be, by non-limiting example, a spin-transfer torque magnetoresistive random access memory (STT-MRAM) element 210 in memory array 201. Generally, the information stored in memory cell 215 is read by supplying a read current to one end of resistors 210, grounding the source (ground connection) 214 of isolation transistor 225 and determining the resistance $R_{bit}$ of the memory element 210. A word line (WL) 212 connects to the gate terminal of each isolation transistor 225 in a row of memory cells 215. A decoder 230 couples to word lines 212 and decodes address input A0 and A1 to select one of word lines 212. Memory array 201 includes a plurality of bit lines 224 coupled to binarizer 270, and outputs (output currents) 279 of binarizer 270 are coupled to summer 280. The single output of summer 280 is coupled to quantizer (current quantizer) 240, which generates data bits D0, D1, D2, D3.

The read data path of Memory 200 includes a binarizer 270 having voltage clamping transistors (clamp transistors, voltage clamp transistors) 291 through 294, and load transistors (transistors) 271 through 278. In implementations, the load transistors 271 through 274 may be diode connected PMOS load transistors. Diode connected transistors have a gate that is coupled to their drain. Load transistors 271 and 278 form a current copier and multiplier configuration commonly known in the art as a current mirror. Load transistors 271, 272, 273, and 274 form the same current mirror (weighted current mirror) configuration with transistors 278, 277, 276 and 275, respectively. Load transistors 271, 272, 273, and 274 are coupled to clamp transistors 291, 292, 293, and 294, respectively. Voltage clamp transistors 291 through 294 are coupled to a control terminal 296 that is biased with a clamp voltage $V_{clamp}$. The clamp transistors 291 through 294 are coupled to bit lines 224, which are in turn coupled to isolation transistors 225 via the resistive memory elements 210 of the corresponding memory cells 215. The resistive memory elements (RMEs) 210 may each include a magnetic tunnel junction (MTJ) illustrated as a resistance $R_{bit}$, which includes a logic "0" or logic "1" resistance value. The isolation transistors 225 are coupled to ground. The gates of the isolation transistors 225 are coupled to one of the plurality of word lines 212. In this embodiment, the isolation transistors 225 are NMOS transistors.

Memory 200 operates in current mode of read operation, where voltage is forced and current is measured. A voltage mode of read operation may be utilized in other implementations. In current mode of read operation, binarizer 270 in memory 200 includes a voltage clamping feature, where clamp transistors 291 through 294 clamp the bit lines 224 to $V_{clamp}-V_{tn}$, where $V_{tn}$ is threshold voltage of NMOS clamp transistors 291 through 294. The $V_{clamp}-V_{tn}$ is referred to as bit line bias voltage $V_b$. Clamping forces the bit lines 224 to a constant bias voltage (ignoring random $V_{tn}$ variations) thereby eliminating voltage swings on bit lines 224. Load transistors 271, 272, 273, and 274 in binarizer 270 are coupled to clamp transistors 291, 292, 293, and 294 to generate each data signal. Each data signal is represented as one of current values (currents, bit line currents, memory cell outputs) 263 (I0), 264 (I1) 265 (I2), 266 (I3). Currents I0, I1, I2, and I3 are binarized while flowing through binarizer 270 generating binary weighted currents (output currents, binary weighted memory cell outputs, binary weighted bit line currents) 283 ($I_b0$), 284 ($I_b1$), 285 ($I_b2$), and 286 ($I_b3$), where the I0/$I_b0$ pair are the least-significant-bit (LSB) pair and the I3/$I_b3$ pair are the most-significant-bit (MSB) pair. Currents $I_b0, I_b1, I_b2$, and $I_b3$ are summed via summer 280 represented in FIG. 2 as having a node 282 and an output current (analog signal, analog output current) 288 ($I_{out}$). Summer 280 in memory 200 is a simple wire sum based on Kirchhoff's current law, which is coupled to a four-bit current quantizer 240.

In memory 200, a resistance $R_{bit}$ of the resistive memory element 210 can be either set to a logical "0" state, resulting in a low resistance setting, R, or set to a logical "1" state, resulting in a high resistance setting, R+66 R. Therefore, $R_{bit}$ can be stated as:

$$R_{bit}=R+\Delta R*d_n$$

where n is a positive integer. In a logical "0" state $R_{bit}=R$, since $d_n=0$, and in a logical "1" state $R_{bit}=R+\Delta R$, since $d_n=1$. Consequently, currents I3, I2, I1 and I0 are stated as:

$$I_3 = \frac{V_{clamp} - V_{tn}}{R + \Delta R * d_3} = \frac{V_b}{R + \Delta R * d_3}$$

$$I_2 = \frac{V_{clamp} - V_{tn}}{R + \Delta R * d_2} = \frac{V_b}{R + \Delta R * d_2}$$

$$I_1 = \frac{V_{clamp} - V_{tn}}{R + \Delta R * d_1} = \frac{V_b}{R + \Delta R * d_1}$$

$$I_0 = \frac{V_{clamp} - V_{tn}}{R + \Delta R * d_0} = \frac{V_b}{R + \Delta R * d_0}$$

Above listed equations for currents I0, I1, I2 and I3 demonstrate that they are a function of input digital code or data written into four RMEs 210 coupled to one word line (WL) 212. Subsequently, currents I0, I1, I2, and I3 are further processed in binarizer 270, where they are binarily weighted in a manner that corresponds to the significance of that bit in the digital input data, which was written into four RMEs 210 during an earlier program cycle. That is, I0 (the LSB) as a function of $d_0$ gets multiplied by $2^0$, i.e., one unit of current, I1 as a function of $d_1$ gets multiplied by $2^1$, i.e., two units of current, I2 as a function of $d_2$ gets multiplied by $2^2$ i.e., four units of current and I3 (the MSB) as a function of $d_3$ gets multiplied by $2^3$ i.e., eight units of current. Furthermore, currents I0, I1, I2 and I3 can be amplified in addition to receiving binary weights. This translates into a base binarizer 270 gain, which increases effective RME 210 signal and multiplies the least-significant-bit (LSB) current by a factor m. As a result, outputs of the binarizer 270 are stated as:

$$I_{b3} = 8*m*\frac{V_{clamp} - V_{tn}}{R + \Delta R * d_3} = 8*m*\frac{V_b}{R + \Delta R * d_3}$$

-continued $$I_{b2} = 4*m*\frac{V_{clamp} - V_{tn}}{R + \Delta R * d_2} = 4*m*\frac{V_b}{R + \Delta R * d_2}$$

$$I_{b1} = 2*m*\frac{V_{clamp} - V_{tn}}{R + \Delta R * d_1} = 2*m*\frac{V_b}{R + \Delta R * d_1}$$

$$I_{b0} = m*\frac{V_{clamp} - V_{tn}}{R + \Delta R * d_0} = m*\frac{V_b}{R + \Delta R * d_0}$$

In general, binarizer 270 output currents can be stated as:

$$I_{b_{n-1}} = 2^{n-1}*m*\frac{V_{clamp} - V_{tn}}{R + \Delta R * d_{n-1}} = 2^{n-1}*m*\frac{V_b}{R + \Delta R * d_{n-1}}$$

$$I_{b_{n-2}} = 2^{n-2}*m*\frac{V_{clamp} - V_{tn}}{R + \Delta R * d_{n-2}} = 2^{n-2}*m*\frac{V_b}{R + \Delta R * d_{n-2}}$$

$$\vdots$$

$$I_{b_1} = 2^1*m*\frac{V_{clamp} - V_{tn}}{R + \Delta R * d_1} = 2^1*m*\frac{V_b}{R + \Delta R * d_1}$$

$$I_{b_0} = 2^0*m*\frac{V_{clamp} - V_{tn}}{R + \Delta R * d_0} = 2^0*m*\frac{V_b}{R + \Delta R * d_0}$$

where n is equal to number of bits or RMEs 210 which are binarized, and summed, and m is the binarizer 270 gain factor. For example m=1 will result in gain of one with binary weights of 1, 2, 4, and 8, whereas m=2 will result in binary weights of 2, 4, 8, and 16. Gain factor in can be written as $m=2^k$, where k is an additional bit of resolution for memory 200 read data path above and beyond the inherent n bits. At k=0, m=1, no additional resolution is achieved and there is no change in signal-to-noise-ratio (SNR), but at k=1, m=2, one additional bit of resolution and a 6 db increase in SNR is achieved. Variable k can be any positive real number.

In binarizer 270 currents I0, I1, I2 and I3 are binarily weighted and amplified via current mirrors (weighted current mirrors) formed by PMOS transistor pairs such as 271 and 278. Pairs 271 and 278 multiply current I3 by eight since the width W of PMOS transistor 278 is 8 times width W of PMOS transistor 271. Similarly PMOS transistor pair 277 and 272 have a four-to-one relationship, PMOS transistor pair 276 and 273 have a two-to-one width W ratio, and PMOS transistor pair 275 and 274 have one-to-one width W ratio.

The read data path of memory 200 is a four bit read data path, which includes four memory cells 215, four clamp transistors 291-294, four weighted current mirrors, a four input summer 280, and a four bit quantizer 240. Therefore, the read operation system and methodology of memory 200 is capable of resolving four bits of stored data simultaneously. It should be understood by those skilled in the art that a higher or lower number of stored bits of data can be resolved through simple modifications. For example an eight bit wide memory with an eight bit read data path can be implemented if the read data path includes eight memory cells 215, eight clamp transistors, eight weighted current mirrors, an eight input summer, and an eight bit quantizer. Many other configurations are also possible using the principles disclosed herein.

The 4-bit current quantizer in memory 200 is a high speed multi-bit analog-to-digital converter (ADC), which converts output current 288 ($I_{out}$) of summer 280 to a four bit digital code exactly matching the data stored in a prior program cycle in four selected resistive memory elements (RMEs) 210.

Figure 3:
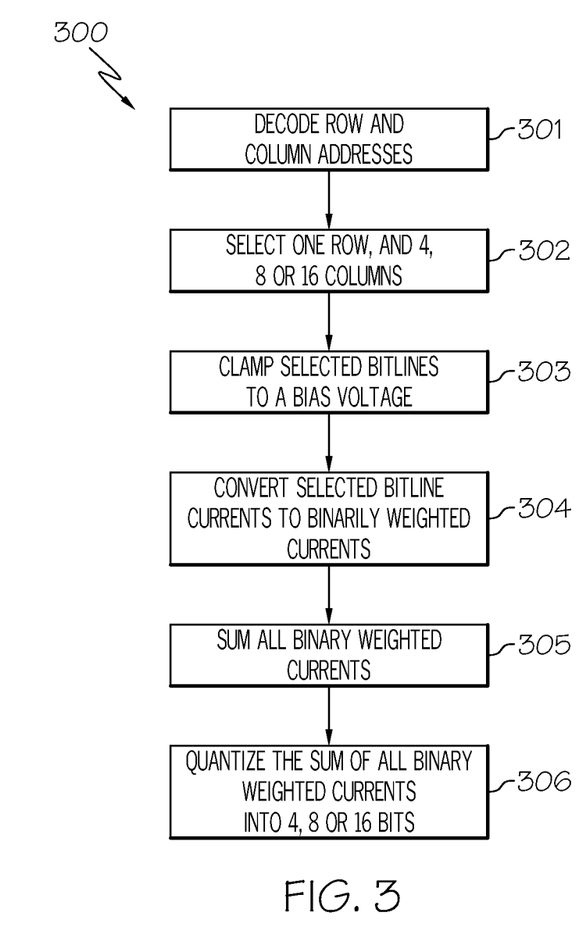
FIG. 3 is an illustration of methods related to an implementation of a resistance based memory device.

Referring to FIG. 3, a flow diagram of a particular illustrative implementation of a method of operating a memory device (method of using a memory device) 300 using a binarizer (binarizing block) 270, summer (summing block) 280 and quantizer (quantizing block) 240 is depicted. The method includes a decoding 301 of row and column addresses and a selection 302 of one row and a group of four, eight or sixteen columns. For example in memory 200 in FIG. 2, one word line 212 is selected and four columns are activated. There is no column selection necessary in memory 200, since it is a four bit wide memory and has a 4×4 memory array 201.

The method further includes the application 303 of a control voltage to clamp transistors 291 through 294 coupled to bit lines 224 to set individual bit line bias voltages such that bit line voltage swings are eliminated. Clamping of bit lines is used in current mode of read operation.

In implementations the method includes the assignment 304 of a weight, such as a binary weight, to selected bit line currents 263-266 of a memory array 201 such that the bit line current ratios are exactly a factor of two, in which case the bit lines are binary weighted. For example in memory 200 in FIG. 2 weights of bit line currents I3, I2, I1, and I0 are $2^3$, $2^2$, $2^1$ and $2^0$, respectively.

In implementations the method includes a summation 305 of binary weighted bit line currents 283-286. In FIG. 2 binary weighted currents $I_b3$, $I_01$, $I_b2$, and $I_b0$ are linearly combined to generate ($I_{out}$).

In implementations the method includes a quantization 306 of a sum $I_{out}$ of all binary weighted currents 283-286 into a four, eight, or sixteen bit digital code. The quantization 306 takes place via a current quantizer 240, which in implementations may be, by no example, a current mode multibit analog-to-digital converter (ADC). A variety of multi-bit high bandwidth voltage or current mode ADC implementations can be used to perform the quantization 306.

In implementations the method includes providing an array of memory cells 201. In various implementations the method includes decoding at least one group of 4n bit line addresses (where n is a positive integer), selecting the decoded bit lines, passing each bit line current 263-266 through a pair of load transistors (among transistors 271-278) configured to binarily weight the bit line current 263-266 through a current mirror, and amplifying the bit line currents 263-266. In implementations the method includes providing an array of memory cells 201, each memory cell 215 having a resistive memory element 210 programmable between a high resistance state and a low resistance state.

Figure 6:
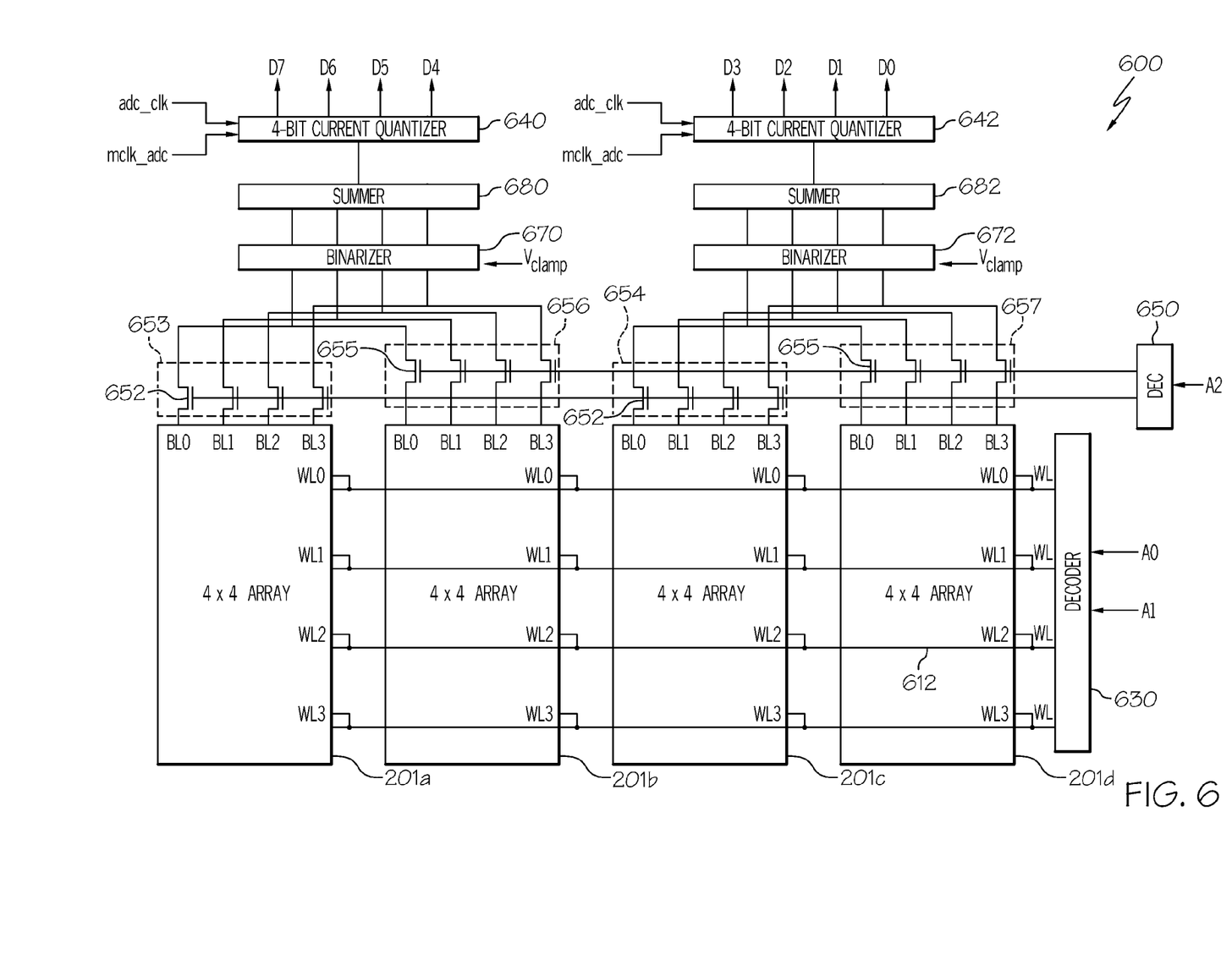
FIG. 6 is an illustration of an implementation of a resistance based memory device.

In implementations the method includes providing a plurality of arrays of memory cells 201, each array of memory cells 201 called a macro portion 201 (such as, by non-limiting example, macro portions 201a, 201b, 201c and 201d illustrated in FIG. 6), and providing a plurality of bit line select blocks 653, 654, 656, 657, electrically coupling each macro portion 201 to one of the bit line select blocks 653, 654, 656, 657 and further coupling each macro portion 201 to a first decoder 630 through word lines 612, the first decoder 630 configured to decode one of a first and second address input (A0 and A1) to select a word line 612, and coupling each bit line select block 653, 654, 656, 657 to a second decoder 650 configured to decode a third address input (A2) to select one of the bit line select blocks 653, 654, 656, 657.

In implementations the method includes decoding an address (third address input) (A2) associated with a bit line select block 653, 654, 656, 657 through a second decoder 650 and selecting a bit line select block 653, 654, 656, 657 associated with that address (A2), decoding a word line address (first address input A0 and second address input A1) of the array of memory cells 201 through a decoder (first decoder) 630 and selecting the decoded word line 612, applying a voltage to memory cells 215 of the selected word line 612, assigning binary weights to bit line currents to form binary weighted bit line currents, summing the binary weighted bit line currents to generate an analog output current, and quantizing the analog output current into a 4n bit digital code through a quantizer, where n is a positive integer.

Figure 8:
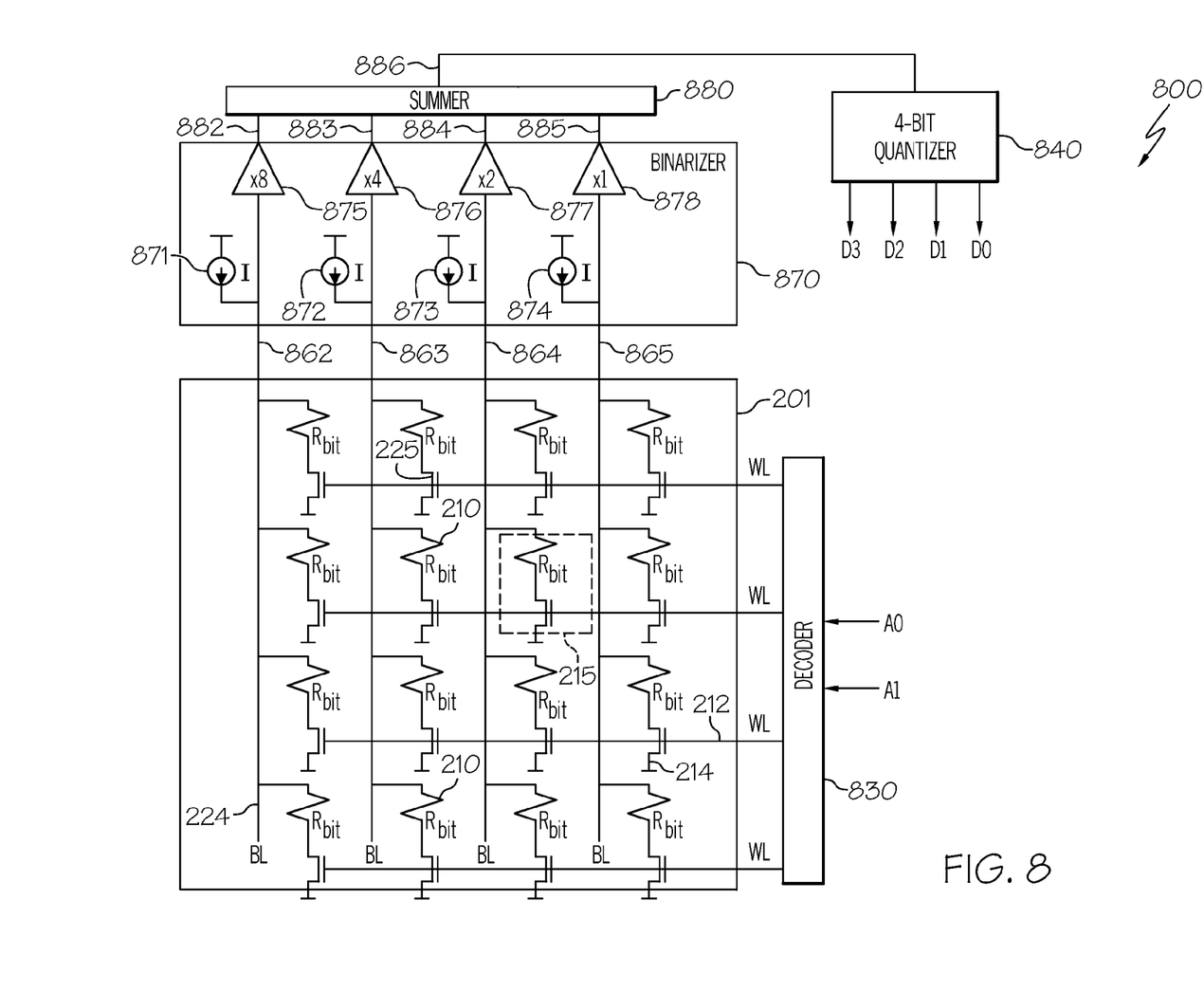
FIG. 8 is an illustration of an implementation of a resistance based memory device.

In implementations the method includes decoding at least one group of 4n bit line addresses of the array of memory cells 201 and selecting the decoded bit lines, and applying current to clamp transistors coupled to memory cells 215 of the selected bit lines, wherein n is a positive integer. In particular implementations, assigning binary weights to bit line voltages 862-865 includes assigning binary weights to bit line voltages 862-865 with voltage multipliers 875-878.

In implementations the method includes providing a plurality of arrays of memory cells 201, each array of memory cells 201 called a macro portion 201 (such as macro portion 201a, macro portion 201b, macro portion 201c, macro portion 201d, and so forth), and providing a plurality of bit line select blocks 653, 654, 656, 657, electrically coupling each macro portion 201 to one of the bit line select blocks 653, 654, 656, 657 and further coupling each macro portion 201 to a first decoder 650 through word lines 612, where the first decoder 650 is configured to decode one of a first and second address input (A0 and A1, respectively) and to select a word line 612. The method also includes coupling each bit line select block 653, 654, 656, 657 to a second decoder 650 configured to decode a third address input (A2) to select one of the bit line select blocks 653, 654, 656, 657. In implementations the method includes decoding an address (A2) associated with a bit line select block 653, 654, 656, 657 through a second decoder 650 and selecting a bit line select block 653, 654, 656, 657 associated with that address (A2).

Figure 4:
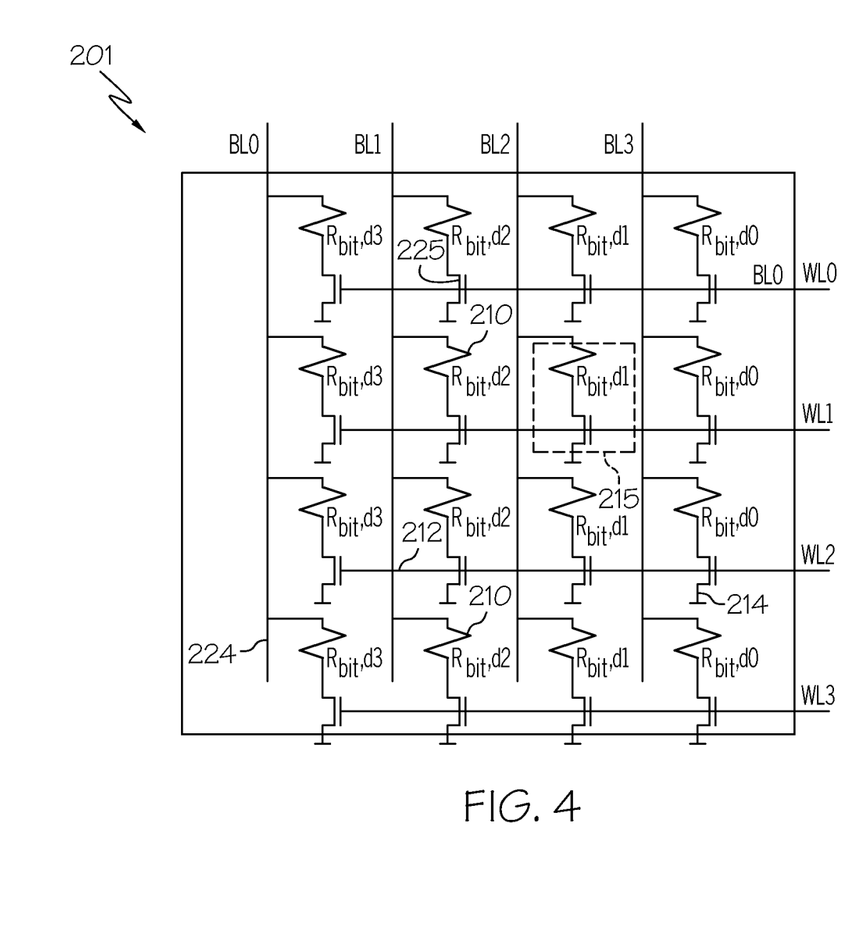
FIG. 4 is an illustration of a 4×4 array (macro portion) of an implementation of a resistance based memory device.
Figure 5:
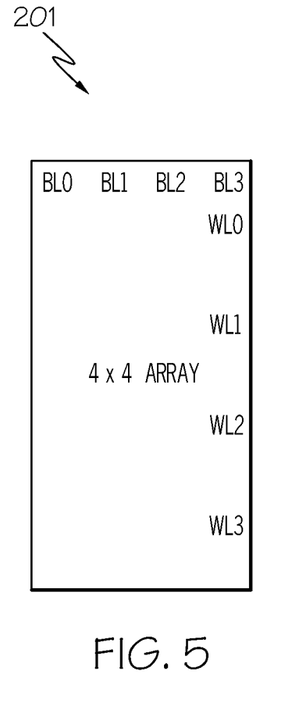
FIG. 5 is an illustration of a 4×4 array (macro portion) of an implementation of a resistance based memory device.

Memory array 201 illustrated in FIG. 2 can be used to form larger memory arrays. Therefore, array 201 is illustrated separately in FIG. 4, herein designated as macro portion 201, having bit lines BL0 through BL3 and word lines WL0 through WL3, and as a simplified block in FIG. 5. For example, in FIG. 2, array 201 shows a 4×4 array. However, the arrays can be easily expanded to far larger arrays using macro portions 201. For example, a number n of macro portions 201 can be assembled in x- and y-directions, and any size ReRAM can be fabricated, wherein n is any positive integer. Referring additionally to FIG. 6, a memory (memory device) 600 is illustrated in which a plurality of four macro portions 201 are combined as described in conjunction with the architecture of FIG. 2. In memory 600 it can be seen that macro portions 201a and 201b are coupled to bit line select blocks (bit line selection blocks) 653 and 656, and bit line select blocks 653 and 656 are coupled to binarizer (bit line voltage clamp and binary weighting block) 670. The macro portions 201a and 201b are coupled to decoder (first decoder) 630, through word lines (WL) 612, where decoder 630 decodes address input A0 and A1 to select one of word lines 612. Similarly, in memory 600 macro portions 201c and 201d are coupled to bit line select blocks (bit line selection blocks) 654 and 657, and bit line select blocks 654 and 657 are coupled to binarizer (bit line voltage clamp and binary weighting block) 672. The macro portions 201c and 201d are coupled to decoder 630, through word lines 612, where decoder 630 decodes address input A0 and A1 to select one of word lines 612. Bit line select blocks 653, 656, 654, and 657 are coupled to decoder (second decoder) 650, where address input (address) A2 (third address input) is decoded to select one of bit line select blocks 653 and 654, or 656 and 657.

Bit line select blocks 653 and 656 couple one of macro portions 201a or 201b through NMOS devices 652 and 655 to binarizer 670. Binarizer 670 is coupled to summer (summing block) 680, and finally summer 680 is coupled to quantizer (multi-bit current quantizer) 640. Similarly, bit line select blocks 654 and 657 couple one of macro portions 201c or 201d through NMOS devices 652 and 655 to binarizer 672. Binarizer 672 is coupled to summer (summing block) 682, and finally summer 682 is coupled to quantizer (multi-bit current quantizer) 642.

Memory 600 in FIG. 6 is an eight bit wide memory, where two identical parallel four bit read data paths generate output data bits D0 through D7, simultaneously. Outputs (output data bits) (data bits) (digital outputs) D0, D1, D2, and D3 are generated by right side four bit read data path including macro portions 201c and 201d, bit line selection blocks 654 and 657, bit line voltage clamp and binary weighting block 672, summing block 682, and a multi-bit current quantizer 642. Similarly, outputs (output data bits, data bits, digital outputs) D4, D5, D6, and D7 are generated by left side four bit read data path including macro portions 201a and 201b, bit line selection blocks 653 and 656, bit line voltage clamp and binary weighting block 670, summing block 680, and a multi-bit current quantizer 640. The left and right four bit read data paths of memory 600 in FIG. 6 are similar to the single four bit read data path of memory 200 in FIG. 2. Although the macro portions 201 are described as operating in pairs, in implementations more macro portions 201 could be used along with a corresponding number of bit line selection blocks. It will be further understood that it is possible to assemble multiple four bit read data paths to generate wider memories such as 12 or 16 bit wide memories. Although a four bit read data path is described, in implementations an eight or higher bit read data path could be implemented.

Figure 7:
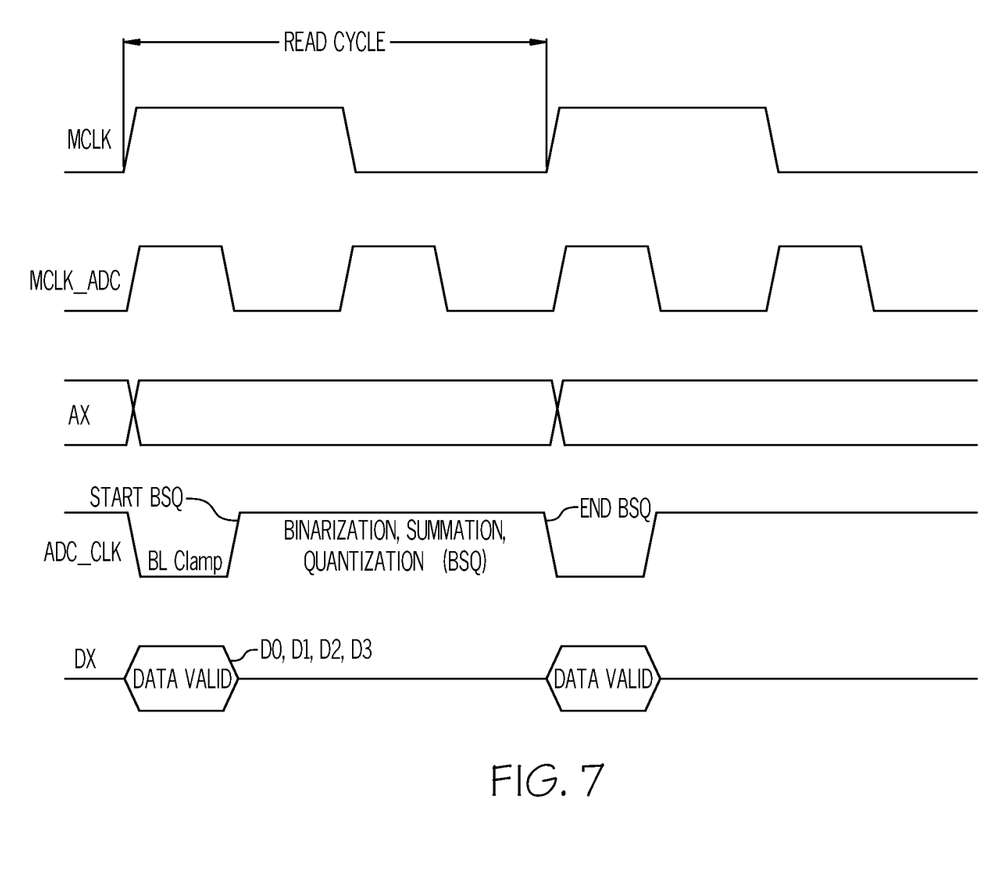
FIG. 7 is an illustration of a timing chart related to signals of an implementation of a resistance based memory device.

Turning additionally to FIG. 7, a read cycle of a memory device is illustrated. Upon the rising edge of MCLK clock signal, a MCLK_ADC clock signal, and ADC_CLK clock signal is generated in a read cycle. The following operations occur during the various clock signals. During entire ADC_CLK clock cycle all addresses, AX are stable. Word and bit line selections, and bit line clamping (BL Clamp) are complete during the low state of ADC_CLK. Binary weighting, summation, and quantization start on high going edge of ADC_CLK, and end on low going edge of ADC_CLK. Output data bits, DX are always valid at the beginning of the following cycle, illustrated in FIG. 7 as "Data Valid". The binarization, summation, and quantization operations are referred to as the BSQ steps in FIG. 7. "AX" refers to input addresses to the memory, which signifies the location of the memory cell in an array. "DX" is the output data bits of the memory, which is the data that comes out of the memory. "Data Valid" implies a portion of time out of total memory access time where data is ready and available for use.

The read data path of memory 200 in FIG. 2 can be implemented in voltage mode of read operation. The voltage mode of read operation is depicted in FIG. 8, Memory (memory device) 800 in FIG. 8 uses the same memory array 201 illustrated in FIG. 2. A decoder 830 decodes address inputs A0 and A1 to select one of word lines 212. Memory cells 215 coupled to bit lines 224 and ground connection 214 are enabled along a selected word line 212, where memory cells 215 include a resistive memory element (RME) 210 and an isolation transistor 225. Memory cells 215 are coupled to binarizer 870 through bit lines 224. Binarizer 870 includes current sources 871 through 874 and voltage multipliers 875, 876, 877, and 878. Current sources 871 through 874 coupled to bit lines 224 force constant currents I through enabled memory cells along a selected word line 212. Bit line voltages (memory cell outputs) 862 (V3), 863 (V2), 864 (V1), and 865 (V0) are developed as a result of current I multiplied by RME 210 resistance Rbit. Voltage multipliers 875, 876, 877, and 878 assign a weight to voltages V3, V2, V1, and V0 such that they are binarily weighted, i.e. weights of bit line voltages V3, V2, V1, and V0 are $2^3$, $2^2$, $2^1$ and $2^0$, respectively. Summer 880 combines binary weighted voltages (binary weighted memory cell outputs) (binary weighted bit line voltages) 882 ($V_b3$), 883 ($V_b2$), 884 ($V_b1$), and 885 ($V_b0$) and generates voltage (analog signal) (analog output voltage) 886 ($V_{out}$). Quantizer 840 quantizes voltage $V_{out}$ into a four bit digital code.

In implementations a read data path of a memory device may include a 4n bit data path which includes 4n memory cells, 4n clamp transistors, 4n weighted current mirrors, a 4n input summer and a 4n bit quantizer, and wherein the memory device is configured to resolve 4n bits of stored data simultaneously, wherein n is a positive integer. In implementations a plurality of arrays of memory cells 201 may form a plurality of identical parallel four bit read data paths to generate 4n output data bits, where n is a number corresponding with the number of identical parallel four bit read data paths.

In implementations a read data path of a memory device may include a (4+m)n data path, where m is an integer and n is a positive integer. Thus the macro portion, binarizer(s) and quantizer(s) could comprise a data path of 4, 5, 6, 7, and so on. As an example, in one implementation m=2 and n=3, thus (4+2)3=18 produces an 18 bit wide memory device. In implementations the 4 of the (4+m)n could be replaced by a three, a two, or another number. In implementations (4+m) corresponds with the number of bit lines per array of memory cells and n corresponds with the number of arrays of memory cells. In implementations a plurality of arrays of memory cells may form a plurality of identical parallel (4+m) bit read data paths to generate (4+m)n output data bits, where m is an integer and n is a positive integer corresponding with the number of identical parallel (4+m) bit read data paths.

In implementations a method of using a memory device may include decoding at least one group of (4+m)n bit line addresses of an array of memory cells and selecting the decoded bit lines, and applying a control voltage to clamp transistors coupled to memory cells of the selected bit lines, wherein in is an integer and n is a positive integer. In implementations a method of using a memory device may include decoding a word line address of an array of memory cells through a decoder and selecting the decoded word line, each memory cell including a resistive memory element programmable between a high resistance state and a low resistance state; applying a current to memory cells of the selected word line; assigning binary weights to bit line voltages to form binary weighted bit line voltages; summing the binary weighted bit line voltages to generate an analog output voltage; and quantizing the analog output voltage into a (4+m)n bit digital code through a quantizer, wherein m is an integer and n is a positive integer. In implementations the method may include decoding at least one group of (4+m)n bit line addresses of the array of memory cells, selecting the decoded bit lines, and applying the current to clamp transistors coupled to memory cells of the selected bit lines, wherein in is an integer and n is a positive integer.

In implementations a quantizer may be located at any distance from an array of memory cells and/or from a summer, such as across a chip such as a microcontroller, microprocessor, or DSP, and does not have to be next to or adjacent to either of them.

In implementations a resistive memory device 100, 200, 600, 800 may include, by non-limiting example: a magnetic tunnel junction; multi-level resistive memory cells; and/or three-dimensional (3D) stacked memory cells. In implementations the memory cells may store more than one bit of encoded data. In implementations the memory cells may store 2 bits (4 levels) of encoded data, and the resistive memory device 100, 200, 600, 800 may function or may be configured to function with such multi-bit memory cells. For example, in implementations, if a memory cell has two bits of encoded data, the resistive memory device 100, 200, 600, 800 in a (4+0)1 configuration may read 6 bits at the same time, while the size of the binarizer and summer may remain at 4, and the quantizer may be increased to 6 bits. Thus, in implementations the resistive elements may be programmable to multi-level states in a single stack or three-dimensional multi-stack structure.

The various illustrative logical blocks, configurations, modules, circuits, and algorithm steps described in connection with the embodiments disclosed herein may be implemented as electronic hardware, computer software, or combination of both. The described functionalities may be implemented in varying ways, including modifications and improvements, for each particular application without departing from the scope of the present disclosure. The general principles defined herein may be applied to other embodiments without departing from the scope of the disclosure. The present disclosure is not limited to the embodiments shown and/or described herein.

In places where the description above refers to particular implementations of resistance based memories, it should be readily apparent that a number of modifications may be made without departing from the spirit thereof and that these implementations may be applied to other resistance based memory devices and related methods.

What is claimed is:

1. A memory device, comprising:
   an array of memory cells, each memory cell comprising a memory element programmable between a first memory state and a second memory state;
   a decoder electrically coupled to one or more word lines comprised in the array of memory cells, the decoder configured to decode an address input to select a word line of the one or more word lines comprised in the array of memory cells;
   a binarizer electrically coupled to the array of memory cells and configured to receive a plurality of memory cell outputs from the array of memory cells and generate a plurality of binary weighted memory cell outputs in response to the decoder selecting a word line of the one or more word lines of the array of memory cells, wherein each binary weighted memory cell output corresponds with one memory cell;
   a summer electrically coupled to the binarizer and configured to sum the binary weighted memory cell outputs into an analog signal; and
   a quantizer electrically coupled to the summer and configured to convert the analog signal into a digital output.

2. The device of claim 1, wherein the binarizer comprises a voltage clamping transistor and at least one pair of load transistors and the pair of load transistors is configured to binarily weight and amplify, through a current mirror, a current corresponding with a memory cell.

3. The device of claim 1, wherein the digital output is a plurality of data bits corresponding with data stored on memory cells of a word line of the one or more word lines of the array of memory cells.

4. The device of claim 1, wherein a read data path of the memory device comprises a (4+m)n bit data path which comprises (4+m)n memory cells, (4+m)n clamp transistors, (4+m)n weighted current mirrors, a (4+m)n input summer and a (4+m)n bit quantizer, and wherein the memory device is configured to resolve (4+m)n bits of stored data simultaneously, wherein m is an integer and n is a positive integer.

5. The device of claim 1, further comprising a plurality of arrays of memory cells and a plurality of bit line select blocks, each array of memory cells forming a macro portion, each macro portion electrically coupled to one of the bit line select blocks and further coupled to a first decoder through word lines, where the first decoder is configured to decode one of a first and second address input to select a word line, and wherein each bit line select block is coupled to a second decoder configured to decode a third address input to select one of the bit line select blocks.

6. The device of claim 1, wherein a plurality of arrays of memory cells form a plurality of identical parallel (4+m) bit read data paths to generate (4+m)n output data bits, where m is an integer and n is a positive integer corresponding with the number of identical parallel (4+m) bit read data paths.

7. The device of claim 1, wherein the memory device comprises: four 4×4 arrays of memory cells; four bit line select blocks, each bit line select block electrically coupled to one 4×4 array of memory cells; two binarizers, each binarizer electrically coupled to two bit line select blocks; two summers, each summer electrically coupled to one binarizer; and two 4-bit current quantizers, each 4-bit current quantizer coupled to one summer.

8. The device of claim 1, wherein the memory elements each comprise an isolation transistor.

9. The device of claim 1, wherein the memory elements each include a magnetic tunnel junction.

10. A method of using a memory device, comprising:
    decoding a word line address of an array of memory cells through a decoder and selecting the decoded word line, each memory cell comprising memory element programmable between a first memory state and a second memory state;
    applying a control voltage to clamp transistors coupled to memory cells of the selected word line;
    assigning binary weights to bit line currents to form binary weighted bit line currents;
    summing the binary weighted bit line currents to generate an analog output current; and
    quantizing the analog output current into a 4n bit digital code through a current quantizer, where n is a positive integer.

11. The method of claim 10, further comprising decoding at least one group of (4+m)n bit line addresses of the array of memory cells and selecting the decoded bit lines, and applying the control voltage to clamp transistors coupled to memory cells of the selected bit lines, wherein m is an integer and n is a positive integer.

12. The method of claim 10, wherein assigning weights to bit line currents comprises passing each bit line current through a pair of load transistors configured to binarily weight the bit line current through a current mirror.

13. The method of claim 10, further comprising amplifying the bit line currents.

14. The method of claim 10, further comprising providing a plurality of arrays of memory cells, each array of memory cells forming a macro portion, and providing a plurality of bit line select blocks and electrically coupling each macro portion to one of the bit line select blocks and further coupling each macro portion to a first decoder through word lines where the first decoder is configured to decode one of a first and second address input to select a word line, and further coupling each bit line select block to a second decoder configured to decode a third address input to enable selection of one of the bit line select blocks.

15. The method of claim 10, further comprising decoding an address associated with a bit line select block through a second decoder and selecting a bit line select block associated with that address.

16. A method of using a memory device, comprising:
- decoding a word line address of an array of memory cells through a decoder and selecting the decoded word line, each memory cell comprising a memory element programmable between a first memory state and a second memory state;
- applying a current to memory cells of the selected word line;
- assigning binary weights to bit line voltages to form binary weighted bit line voltages;
- summing the binary weighted bit line voltages to generate an analog output voltage; and
- quantizing the analog output voltage into a (4+m)n bit digital code through a quantizer, wherein m is an integer and n is a positive integer.

17. The method of claim 16, further comprising decoding at least one group of (4+m)n bit line addresses of the array of memory cells, selecting the decoded bit lines, and applying the current to clamp transistors coupled to memory cells of the selected bit lines, wherein in is an integer and n is a positive integer.

18. The method of claim 16, wherein assigning binary weights to bit line voltages comprises assigning binary weights to bit line voltages with voltage multipliers.

19. The method of claim 16, further comprising:
- providing a plurality of arrays of memory cells, each array of memory cells forming a macro portion;
- providing a plurality of bit line select blocks;
- electrically coupling each macro portion to one of the bit line select blocks and further coupling each macro portion to a first decoder through word lines, where the first decoder is configured to decode one of a first and a second address input to select a word line; and
- coupling each bit line select block to a second decoder configured to decode a third address input to enable selection one of the bit line select blocks.

20. The method of claim 16, further comprising decoding an address associated with a bit line select block through a second decoder and selecting a bit line select block associated with that address.

* * * * *